(12) United States Patent
Leobandung et al.

(10) Patent No.: US 11,114,479 B2
(45) Date of Patent: Sep. 7, 2021

(54) OPTOELECTRONICS AND CMOS INTEGRATION ON GOI SUBSTRATE

(71) Applicant: International Business Machines Corporation, Armonk, NY (US)

(72) Inventors: Effendi Leobandung, Stormville, NY (US); Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 16/358,807

(22) Filed: Mar. 20, 2019

(65) Prior Publication Data
US 2019/0221592 A1    Jul. 18, 2019

Related U.S. Application Data

(60) Division of application No. 16/354,249, filed on Mar. 15, 2019, now Pat. No. 10,784,292, which is a
(Continued)

(51) Int. Cl.
*G02B 6/38*     (2006.01)
*G02B 6/12*     (2006.01)
(Continued)

(52) U.S. Cl.
CPC .............. *H01L 27/144* (2013.01); *G02B 6/00* (2013.01); *G02B 6/12004* (2013.01);
(Continued)

(58) Field of Classification Search
CPC ......... G02B 6/38; G02B 6/12005; G02B 6/12
(Continued)

(56) References Cited

U.S. PATENT DOCUMENTS 4,940,672 A * 7/1990 Zavracky ............ H01L 21/8252
                                                    148/DIG. 26
5,021,361 A   6/1991 Kinoshita et al.
(Continued)

FOREIGN PATENT DOCUMENTS

CN        101325154 A     12/2008
CN        101325154 B      9/2011
(Continued)

OTHER PUBLICATIONS

British Search Report, dated Sep. 20, 2016, Application No. GB1604088.3, 8 pages.
(Continued)

*Primary Examiner* — Kaveh C Kianni
(74) *Attorney, Agent, or Firm* — L. Jeffrey Kelly

(57) ABSTRACT

A single chip including an optoelectronic device on the semiconductor layer in a first region, the optoelectronic device comprises a bottom cladding layer, an active region, and a top cladding layer, wherein the bottom cladding layer is above and in direct contact with the semiconductor layer, the active region is above and in direct contact with the bottom cladding layer, and the top cladding layer is above and in direct contact with the active region, a silicon device on the substrate extension layer in a second region, a device insulator layer substantially covering both the optoelectronic device in the first region and the silicon device in the second region, and a waveguide embedded within the device insulator layer in direct contact with a sidewall of the active region of the optoelectronic device.

17 Claims, 6 Drawing Sheets

Related U.S. Application Data division of application No. 15/420,115, filed on Jan. 31, 2017, now Pat. No. 10,283,537, which is a continuation of application No. 15/135,945, filed on Apr. 22, 2016, now Pat. No. 9,601,476, which is a division of application No. 14/661,037, filed on Mar. 18, 2015, now Pat. No. 9,362,444.

(51) Int. Cl.

| | | |
|---|---|---|
| H01L 27/144 | (2006.01) | |
| H01L 31/18 | (2006.01) | |
| H01L 31/0304 | (2006.01) | |
| H01L 21/84 | (2006.01) | |
| H01S 5/026 | (2006.01) | |
| G02B 6/00 | (2006.01) | |
| H01L 25/16 | (2006.01) | |
| H01L 25/00 | (2006.01) | |
| H01S 5/32 | (2006.01) | |
| H01S 5/323 | (2006.01) | |
| H01L 27/092 | (2006.01) | |
| H01S 5/02 | (2006.01) | |

(52) U.S. Cl.
CPC ............ *H01L 21/84* (2013.01); *H01L 25/167* (2013.01); *H01L 25/50* (2013.01); *H01L 27/092* (2013.01); *H01L 31/0304* (2013.01); *H01L 31/184* (2013.01); *H01L 31/1852* (2013.01); *H01S 5/0261* (2013.01); *H01S 5/3211* (2013.01); *H01S 5/32316* (2013.01); *G02B 2006/12078* (2013.01); *G02B 2006/12121* (2013.01); *G02B 2006/12123* (2013.01); *H01S 5/021* (2013.01)

(58) Field of Classification Search
USPC .............................................. 257/90; 385/14
See application file for complete search history.

(56) References Cited

U.S. PATENT DOCUMENTS

| | | | | |
|---|---|---|---|---|
| 5,436,192 A * | 7/1995 | Epler | ................ | H01L 29/66318 257/E21.09 |
| 5,585,957 A * | 12/1996 | Nakao | ................... | B82Y 20/00 257/13 |
| 5,747,860 A * | 5/1998 | Sugiyama | .............. | B82Y 20/00 257/19 |
| 5,805,755 A * | 9/1998 | Amersfoort | ........ | G02B 6/12004 372/46.012 |
| 6,387,720 B1 * | 5/2002 | Misheloff | ................ | G02B 6/42 438/31 |
| 6,614,821 B1 * | 9/2003 | Jikutani | .................. | B82Y 20/00 372/43.01 |
| 6,674,778 B1 * | 1/2004 | Lin | ........................ | B82Y 20/00 372/46.01 |
| 6,965,128 B2 * | 11/2005 | Holm | ................. | H01L 21/8258 257/103 |
| 7,418,166 B1 * | 8/2008 | Kapur | .................. | G02B 6/12007 216/2 |
| 7,932,512 B1 * | 4/2011 | Royter | ................... | B82Y 20/00 257/14 |
| 8,299,485 B2 * | 10/2012 | Celler | ................... | H01L 31/153 257/98 |
| 8,304,859 B2 | 11/2012 | Lee et al. | | |
| 8,436,333 B2 | 5/2013 | Saito et al. | | |
| 8,879,593 B2 * | 11/2014 | Kim | .................... | H01S 5/02268 372/36 |
| 9,166,363 B2 * | 10/2015 | Jain | ........................ | H01S 5/021 |
| 9,274,283 B1 * | 3/2016 | Ellis-Monaghan | ...... | G02B 6/34 |
| 9,362,444 B1 | 6/2016 | Leobandung et al. | | |
| 9,601,476 B2 | 3/2017 | Leobandung et al. | | |
| 2002/0131727 A1 * | 9/2002 | Reedy | ................. | G02B 6/4231 385/88 |
| 2003/0003736 A1 * | 1/2003 | Delwala | ................ | G02B 5/045 438/689 |
| 2003/0015707 A1 * | 1/2003 | Bosco | .................... | H03F 3/087 257/73 |
| 2003/0020069 A1 * | 1/2003 | Holmes | .............. | H01L 21/8221 257/76 |
| 2003/0021014 A1 * | 1/2003 | Barenburg | ........... | H01S 5/4031 359/344 |
| 2003/0022456 A1 * | 1/2003 | Callaway, Jr. | ..... | G02B 6/12004 438/385 |
| 2003/0036213 A1 * | 2/2003 | Brophy | .................... | G02B 6/43 438/31 |
| 2003/0201462 A1 * | 10/2003 | Pommer | .............. | G02B 6/4201 257/200 |
| 2004/0136428 A1 * | 7/2004 | Miyachi | ................ | H01S 5/4043 372/50.1 |
| 2004/0150043 A1 | 8/2004 | Holm et al. | | |
| 2006/0115230 A1 * | 6/2006 | Komoguchi | ...... | H01L 27/14601 385/146 |
| 2007/0105335 A1 * | 5/2007 | Fitzgerald | ............. | H01L 27/144 438/405 |
| 2007/0126085 A1 * | 6/2007 | Kawano | ............... | H01L 23/481 257/621 |
| 2007/0147761 A1 * | 6/2007 | Kwakernaak | .......... | G02B 6/136 385/131 |
| 2008/0128713 A1 * | 6/2008 | Saito | ....................... | H01L 33/34 257/86 |
| 2008/0197362 A1 * | 8/2008 | Hisamoto | ............... | H01L 33/34 257/86 |
| 2009/0022447 A1 * | 1/2009 | Kishima | ................ | G02B 6/1223 385/3 |
| 2009/0072245 A1 | 3/2009 | Noe et al. | | |
| 2009/0134486 A1 * | 5/2009 | Fujikata | .............. | H01L 31/1085 257/449 |
| 2010/0059822 A1 * | 3/2010 | Pinguet | .............. | H04B 10/2575 257/351 |
| 2010/0200941 A1 * | 8/2010 | Fujikata | .............. | H01L 31/1085 257/432 |
| 2011/0012221 A1 * | 1/2011 | Fujikata | ............. | G02B 6/12004 257/458 |
| 2011/0115004 A1 * | 5/2011 | Gebara | ............. | H01L 27/14634 257/292 |
| 2011/0188532 A1 * | 8/2011 | Hata | ....................... | H01S 5/323 372/50.12 |
| 2011/0188533 A1 * | 8/2011 | Lebby | .................... | H01L 27/15 372/50.124 |
| 2014/0241734 A1 * | 8/2014 | Sagawa | .................. | G02B 6/131 398/139 |
| 2014/0291666 A1 * | 10/2014 | Tsang | ................ | H01L 27/156 257/43 |
| 2015/0226918 A1 * | 8/2015 | Bauters | ................ | G02B 6/1225 385/14 |
| 2015/0285998 A1 * | 10/2015 | Babakhani | ........ | H01L 31/02327 438/27 |
| 2016/0109731 A1 * | 4/2016 | Huang | ................ | G02B 6/12002 385/3 |
| 2017/0141142 A1 | 5/2017 | Leobanding et al. | | |
| 2017/0207600 A1 * | 7/2017 | Klamkin | ............. | G02B 6/12002 |
| 2018/0299622 A1 * | 10/2018 | Menard | .................... | G02B 6/00 |
| 2019/0019899 A1 * | 1/2019 | Wang | ............... | H01L 31/02327 |
| 2019/0288132 A1 * | 9/2019 | Wang | .................. | H01L 31/0232 |

FOREIGN PATENT DOCUMENTS

| | | |
|---|---|---|
| CN | 102590936 A | 7/2012 |
| CN | 102590936 B | 4/2013 |
| DE | 102016105057 A1 | 9/2016 |
| GB | 2538594 A | 11/2016 |
| JP | 61264776 A | 11/1986 |

(56) References Cited

OTHER PUBLICATIONS

Pending U.S. Appl. No. 16/354,249, filed Mar. 15, 2019, entitled: "Optoelectronics and CMOS Integration on GOI Substrate", 25 pages.
IBM: List of IBM Patents or Patent Applications Treated as Related (Appendix P), Mar. 27, 2019, 2 pages.

* cited by examiner

OPTOELECTRONICS AND CMOS INTEGRATION ON GOI SUBSTRATE

BACKGROUND

The present invention generally relates to semiconductor device manufacturing, and more particularly to the formation and integration of a III-V semiconductor optoelectronic device and a silicon complementary metal-oxide-semiconductor (CMOS) device on a single chip.

As micro-electronic systems continue to scale down, the resultant electrical interconnect density would have to accommodate increased power dissipation, signal delay and cross-talk, while running at extremely high clock speeds. Current trends indicate that in less than a decade the power consumed by interconnects might become the limiting factor in determining the switching speeds in integrated circuits. To overcome these problems the integration of optical interconnects and systems alongside conventional Silicon (Si) based micro-electronic circuits would be a major step forward. Light based intra and inter-chip communication would diminish latency considerably and reduce power consumption by eliminating capacitive interconnect loss. Improved opto-electronic integration can also help increase the speed of transceiver circuits used in optical communication systems, thereby increasing the overall bandwidth.

SUMMARY

According to one embodiment of the present invention, a method is provided. The method may include forming a semiconductor-on-insulator (SOI) substrate in a first region and a second region, the SOI substrate includes a semiconductor layer on a first insulator layer, and the first insulator layer is on a substrate; removing the semiconductor layer and the insulator layer from the second region, wherein a top surface of the substrate is exposed; forming a second insulator layer on the semiconductor layer in the first region; forming a substrate extension layer on the exposed substrate in the second region; forming the device on the substrate extension layer; forming a device insulator layer covering the device in the second region; forming a waveguide in the second insulator layer; and forming the optoelectronic device in the first region, the optoelectronic device has a bottom cladding layer, an active region, and a top cladding layer, wherein the bottom cladding layer is on the semiconductor layer, the active region is on the bottom cladding layer, and the top cladding layer is on the active region.

According to another embodiment of the present invention, a method is provided. The method may include forming a stack of layers on a substrate in a first region and in a second region, the stack of layers include a semiconductor layer on the substrate, a first insulator layer on the semiconductor layer, a waveguide on the first insulator layer, a second insulator layer on the waveguide, and a device base layer on the second insulator layer; forming the device on the device base layer in the second region; forming a device insulator layer on the device and on the device base layer in the second region; and forming the optoelectronic device in the first region, the optoelectronic device has a bottom cladding layer, an active region, and a top cladding layer, wherein the bottom cladding layer is on the semiconductor layer, the active region is on the bottom cladding layer, and the top cladding layer is on the active region.

According to another embodiment of the present invention, a structure is provided. The structure may include a silicon substrate in a first region and a second region of a single chip; a germanium layer above the substrate in at least the first region; the optoelectronic device on the germanium layer in the first region, the optoelectronic device has a bottom cladding layer, an active region adjacent to a waveguide, and a top cladding layer, wherein the bottom cladding layer is on the germanium layer, the active region is on the bottom cladding layer, and the top cladding layer is on the active region; and the silicon device on a silicon layer in the second region.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
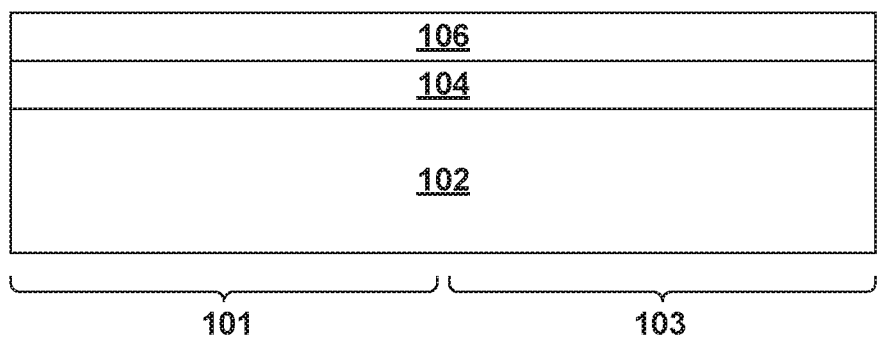
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation and integration of a III-V semiconductor optoelectronic device and a silicon complementary metal-oxide-semiconductor (CMOS) device on a single chip. Ideally, it may be desirable to form a III-V semiconductor optoelectronic device and a silicon CMOS device on the same chip to create new pathways for optical interconnects and to reduce production time and cost. One way to fabricate a III-V semiconductor optoelectronic device and a silicon CMOS device on a single chip may include forming a silicon substrate in a first and second region on a single chip, forming a germanium layer in the first region, using the germanium layer as a seed layer to form a III-V semiconductor optoelectronic device, and using the silicon in the second region as a seed layer to form a silicon CMOS device. One embodiment by which to form an integrated III-V semiconductor optoelectronic device and a silicon CMOS device on the same chip is described in detail below referring to the accompanying drawings FIGS. 1-10. It should be noted, an optoelectronic device may include, for example, an optoelectronic transmitting device, such as a laser, or an optoelectronic receiving device, such as a detector, but other devices may be used.

With reference to FIG. 1, a demonstrative illustration of a structure 100 is provided during an intermediate step of a method of fabricating a III-V semiconductor optoelectronic device and a Si CMOS device on a single chip, according to an embodiment. More specifically, the method can start with providing a semiconductor-on-insulator (SOI) substrate.

The SOI substrate may be in a first region 101 and in a second region 103 of a single chip. The SOI substrate may include (from bottom to top) a substrate 102, a first insulator layer 104, and a semiconductor layer 106. The SOI substrate may be formed using any SOI substrate formation technique known in the art, such as, for example, Separation by Ion Implantation of Oxygen (SIMOX) or layer transfer. If a layer transfer process is employed, an optional thinning step may follow the bonding of two semiconductor wafers together. The optional thinning step can reduce the thickness of a layer to a desirable thickness.

The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. In an embodiment, the substrate 102 is a bulk silicon substrate. The substrate 102 may include, for example; an n-type, p-type, or undoped semiconductor material and may have a monocrystalline, polycrystalline, or amorphous structure.

The first insulator layer 104 may be formed on the substrate 102 using any deposition techniques known in the art, such as, for example; ion implantation, thermal or plasma oxidation or nitridation, chemical vapor deposition, and/or physical vapor deposition. The first insulator layer 104 may be any dielectric material known in the art, such as, for example; oxides, nitrides, or oxynitrides. The first insulator layer 104 may have a thickness ranging from about 1 nm to about 500 nm, but other thicknesses may be used. In an embodiment, the first insulator layer 104 is $SiO_2$ having a thickness of about 200 nm. In another embodiment, the first insulator layer 104 may include multiple dielectric layers or a stack of dielectric layers including a silicon oxide layer and/or a silicon nitride layer. It should be noted; the first insulator layer 104 may also be referred to as a buried dielectric layer or a buried oxide (BOX) layer.

The semiconductor layer 106 may be formed on the first insulator layer 104 using any deposition technique known in the art, such as, for example, chemical vapor deposition, plasma enhanced chemical vapor deposition, atomic layer deposition, or physical vapor deposition. The semiconductor layer 106 may be any semiconductor material known in the art, such as, for example, Si, Ge, SiGe, SiC, SiGeC, InAs, GaAs, InP or other semiconductors. The semiconductor layer 106 may have a thickness ranging from about 1 nm to about 500 nm, but other thicknesses may be used. In an embodiment, the semiconductor layer 106 is germanium and has a thickness of about 100 nm.

In an embodiment, a III-V semiconductor layer may be subsequently formed on the semiconductor layer 106 (further described below). The lattice mismatch is larger between silicon and a III-V semiconductor than between germanium and the III-V semiconductor; therefore, germanium may be a better material to use as the semiconductor layer 106 for the subsequent formation of a III-V semiconductor optoelectronic device.

Figure 2:
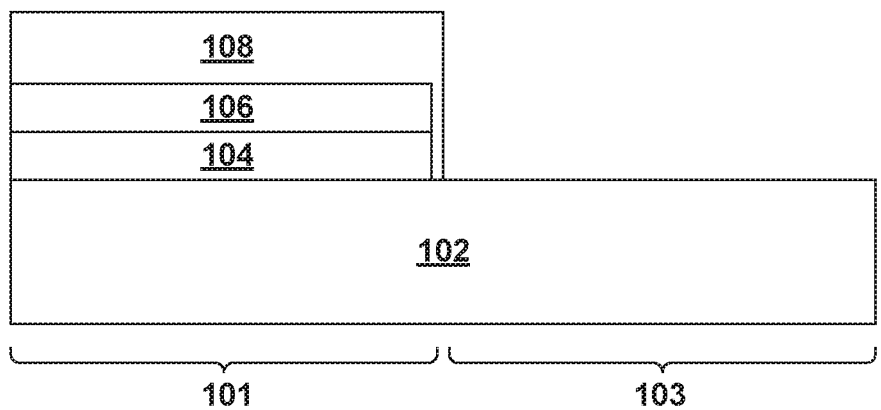
FIG. 2 is a cross section view of the semiconductor structure and illustrates the removal of a semiconductor layer and first insulator layer from a first region of a semiconductor-on-insulator (SOI) substrate, according to an exemplary embodiment.

With reference to FIG. 2, a demonstrative illustration of the structure 100 is provided during an intermediate step of a method of fabricating a III-V semiconductor optoelectronic device and a Si CMOS device on a single chip, according to an embodiment. More specifically, the method can include removing the semiconductor layer 106 and the first insulator layer 104 from the second region 103 and forming a second insulator layer 108 on the semiconductor layer 106.

It should be noted, germanium may be a good material for the growth of a III-V semiconductor optoelectronic device; however, silicon may be better suited for the formation of other devices, such as, for example, a CMOS device. Therefore, the germanium may be removed from the second region 103 to allow for subsequent formation of silicon devices.

The semiconductor layer 106 and the first insulator layer 104 may be removed from the second region 103 using any etching technique known in the art, such as, for example, photolithography and/or reactive ion etching process. A top surface of the substrate 102 may be exposed in the second region 103.

The second insulator layer 108 may be formed on the semiconductor layer 106 using any deposition technique known in the art, such as, for example, chemical vapor deposition, plasma enhanced chemical vapor deposition, atomic layer deposition, or physical vapor deposition. In an embodiment, the second insulator layer 108 is formed on the semiconductor layer 106 by depositing a blanket insulator layer over the semiconductor layer 106 in the first region 101 and the substrate 102 in the second region 103 followed by an etching process removing the blanket insulator layer from the second region 103. The second insulator layer 108 may remain on the semiconductor layer 106 and on sidewalls of the semiconductor layer 106 and first insulator layer 104 adjacent to the second region 103. The second insulator layer 108 may be any dielectric material known in the art, such as, for example, oxides, nitrides, or oxynitrides. The second insulator layer 108 may have a thickness ranging from about 1 μm to about 5 μm, but other thicknesses may be used. In an embodiment, the second insulator layer 108 is the same material as the first insulator layer (e.g., $SiO_2$) and has a thickness of about 2 μm above the semiconductor layer 106.

Figure 3:
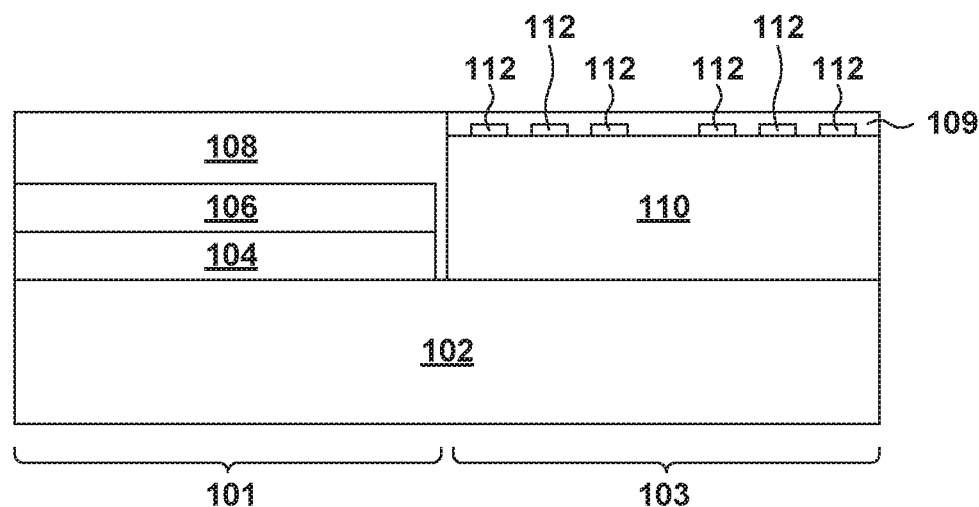
FIG. 3 is a cross section view of the semiconductor structure and illustrates the formation of a device in a second region of the SOI substrate, according to an exemplary embodiment.

With reference to FIG. 3, a demonstrative illustration of the structure 100 is provided during an intermediate step of a method of fabricating a III-V semiconductor optoelectronic device and a Si CMOS device on a single chip, according to an embodiment. More specifically, the method can include forming a device 112 on a substrate extension layer 110 in the second region 103.

The substrate extension layer 110 may be formed on the substrate 102 in the second region 103 using any deposition technique known in the art, such as, for example, epitaxial growth, chemical vapor deposition, plasma enhanced chemical vapor deposition, atomic layer deposition, or physical vapor deposition. The substrate extension layer 110 may be any semiconductor material known in the art, such as, for example, Si, Ge, SiGe, SiC, SiGeC, InAs, GaAs, InP or other semiconductors. In an embodiment, the substrate extension layer 110 is the same material as the substrate 102 (e.g., Si) and the substrate extension layer 110 is grown on the exposed substrate 102 in the second region 103 using an epitaxial growth process.

The device 112 may be formed on the substrate extension layer 110 using any device formation technique known in the art, such as, for example, a deposition, masking, and etching process. The device 112 may be any electrical device known in the art, such as, for example, a Si CMOS device, SiGe or III-V channel MOSFETs, bipolar junction transistors, or any other devices used in the art. In an embodiment, the device 112 is a Si CMOS device. The device 112 may be used to send signals to a laser or detector, as is known in the art. In the illustrated embodiment, two sets of three devices 112 are formed on the substrate extension layer 110; however, other device configurations may be used.

A device insulator layer 109 may be formed on the device 112 using any deposition technique known in the art, such as, for example, chemical vapor deposition, plasma enhanced chemical vapor deposition, atomic layer deposition, or physical vapor deposition. The device insulator layer 109 may be any dielectric material known in the art, such as, for example, oxides, nitrides, or oxynitrides. In an embodiment, the device insulator layer 109 is the same material as the first and second insulator layers 104, 108 (e.g., $SiO_2$). A top surface of the second insulator layer 108 and the device insulator layer 109 may be planarized using any polishing technique known in the art, such as, for example, a chemical-mechanical polishing process.

Figure 4:
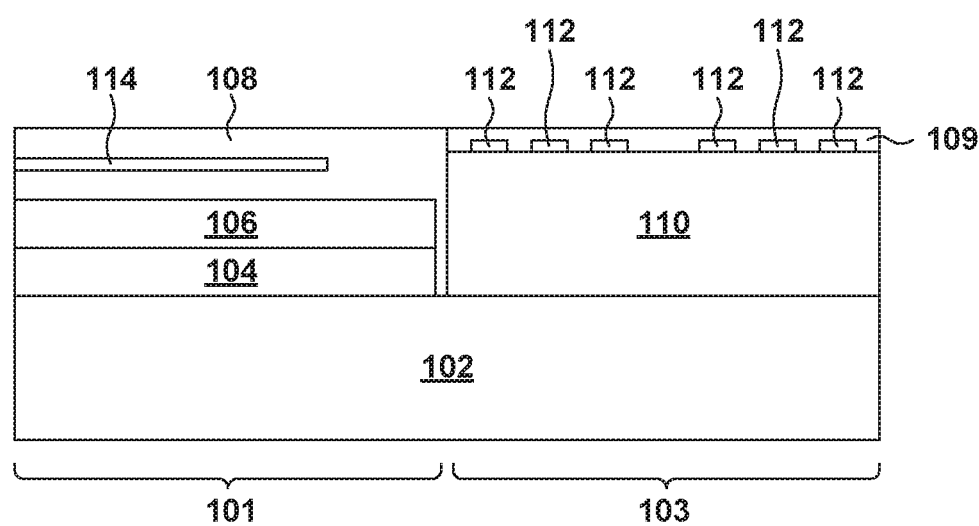
FIG. 4 is a cross section view of the semiconductor structure and illustrates the formation of a waveguide above the semiconductor layer in the first region, according to an exemplary embodiment.

With reference to FIG. 4, a demonstrative illustration of the structure 100 is provided during an intermediate step of a method of fabricating a III-V semiconductor optoelectronic device and a Si CMOS device on a single chip, according to an embodiment. More specifically, the method can include forming a waveguide 114 in the first region 101.

The waveguide 114 may be formed in the first region 101 by etching a trench in the second insulator layer 108, forming the waveguide 114 in the trench, and reforming the second insulator layer 108 above the waveguide 114. The trench may be formed in the second insulator layer 108 using any etching technique known in the art, such as, for example, a reactive ion etching process. A portion of the second insulator layer 108 may remain underneath the trench. The portion of the second insulator layer 108 remaining underneath the trench may have a thickness of about 1 μm. The trench may not extent to the second region 103 (i.e., there may be a portion of the second insulator layer 108 between the trench and the second region 103).

The waveguide 114 may be deposited in the trench using any deposition technique known in the art, such as, for example, chemical vapor deposition, plasma enhanced chemical vapor deposition, atomic layer deposition, or physical vapor deposition. The waveguide 114 may be any waveguide material known in the art, such as, for example, nitrides, oxides, or oxynitrides. In an embodiment, the waveguide 114 is SiN.

The second insulator layer 108 may be reformed on the waveguide 114 using any deposition technique known in the art, such as, for example, chemical vapor deposition, plasma enhanced chemical vapor deposition, atomic layer deposition, or physical vapor deposition. The top surface of the second insulator layer 108 may be planarized using any polishing technique known in the art, such as, for example, a chemical-mechanical polishing process. In an embodiment, the second insulator layer 108 has a thickness of about 1 μm above a top surface of the waveguide 114.

Figure 5:
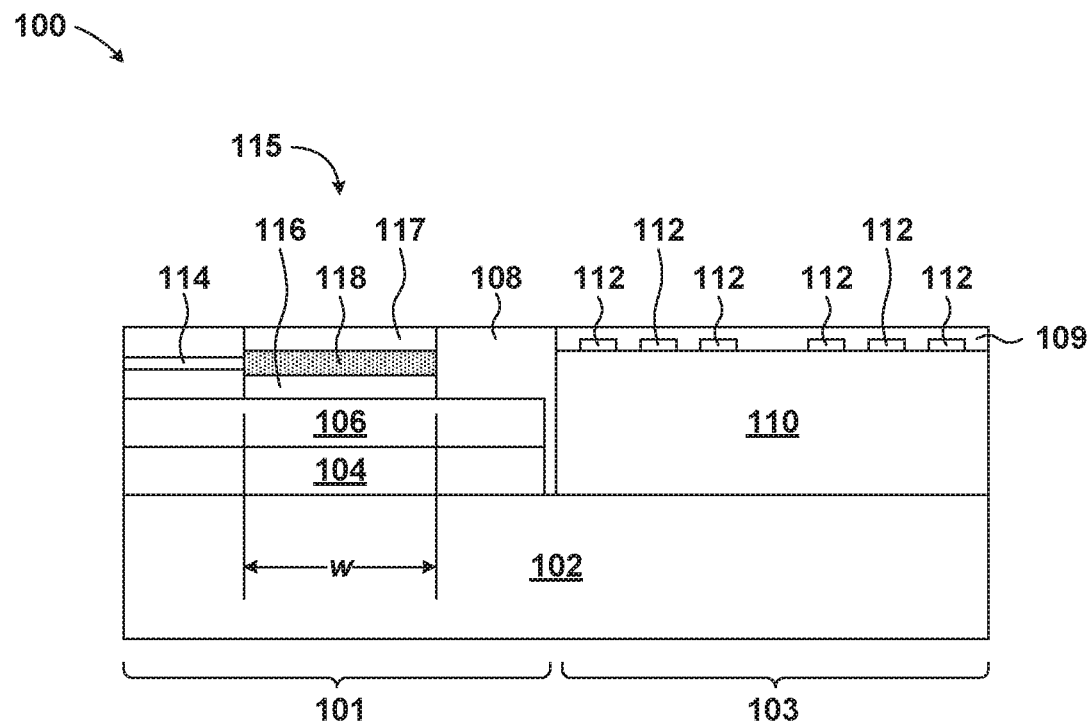
FIG. 5 is a cross section view of the semiconductor structure and illustrates the formation of an optoelectronic device in the first region, according to an exemplary embodiment.

With reference to FIG. 5, a demonstrative illustration of the structure 100 is provided during an intermediate step of a method of fabricating a III-V semiconductor optoelectronic device and a Si CMOS device on a single chip, according to an embodiment. More specifically, the method can include forming an optoelectronic device 115 on the semiconductor layer 106 in the first region 101.

Various types of structures have been advocated for semiconductor lasers and detectors; one typical structure is the double hetero structure. The double hetero structure is a structure such that, using two types of different compound semiconductors, the compound semiconductor with a smaller bandgap is sandwiched between the compound semiconductors with larger bandgaps.

The optoelectronic device 115 may include (from bottom to top) a bottom cladding layer 116, an active region 118, and a top cladding layer 117 (e.g., a double hetero structure). The optoelectronic device 115 may have a width (w) ranging from about 1 µm to about 10 µm and a length ranging from about 100 µm to about 500 µm, but other dimensions may be used.

The optoelectronic device 115 may be formed by etching a trench in the second insulator layer 108 using any etching technique known in the art, such as, for example, a photolithography and/or reactive ion etching process. The trench may be formed in the first region 101 and may expose a top surface of the semiconductor layer 106 and a sidewall of the waveguide 114.

The bottom cladding layer 116 may be formed in the trench and on the semiconductor layer 106 using any deposition technique known in the art, such as, for example, epitaxial growth or chemical vapor deposition. The bottom cladding layer 116 may include any semiconductor material known in the art, such as, for example, IV semiconductors and/or III-V semiconductors. In an embodiment, the bottom cladding layer 116 is AlGaAs. The bottom cladding layer 116 may be doped in-situ and may be p-type or n-type.

The active region 118 may be formed on the bottom cladding layer 116 using any deposition technique known in the art, such as, for example, epitaxial growth or chemical vapor deposition. The active region 118 may include any semiconductor material known in the art, such as, for example, IV semiconductors and/or III-V semiconductors. In an embodiment, the active region 118 is GaAs formed using epitaxial growth. The active region 118 may have the same lattice structure as the bottom cladding layer 116, however, the active region 118 may have a lower bandgap. The active region 118 may be in contact with the sidewall of the waveguide 114, such that signals can flow between the active region 118 and the waveguide 114.

The top cladding layer 117 may be formed on the active region 118 using any deposition technique known in the art, such as, for example, epitaxial growth or chemical vapor deposition. The top cladding layer 117 may include any semiconductor material known in the art, such as, for example, IV semiconductors and/or III-V semiconductors. The top cladding layer 117 may be doped in-situ and may be p-type or n-type. In an embodiment, the top cladding layer 117 is the same material as the bottom cladding layer 116 (e.g., AlGaAs) and may have an opposite charge from the bottom cladding layer 116 (e.g., a p-type top cladding layer 117 and an n-type bottom cladding layer 116). The top and bottom cladding layers 117, 116 may be used as a barrier layer which may confine electrons in the active region 118.

Figure 6:
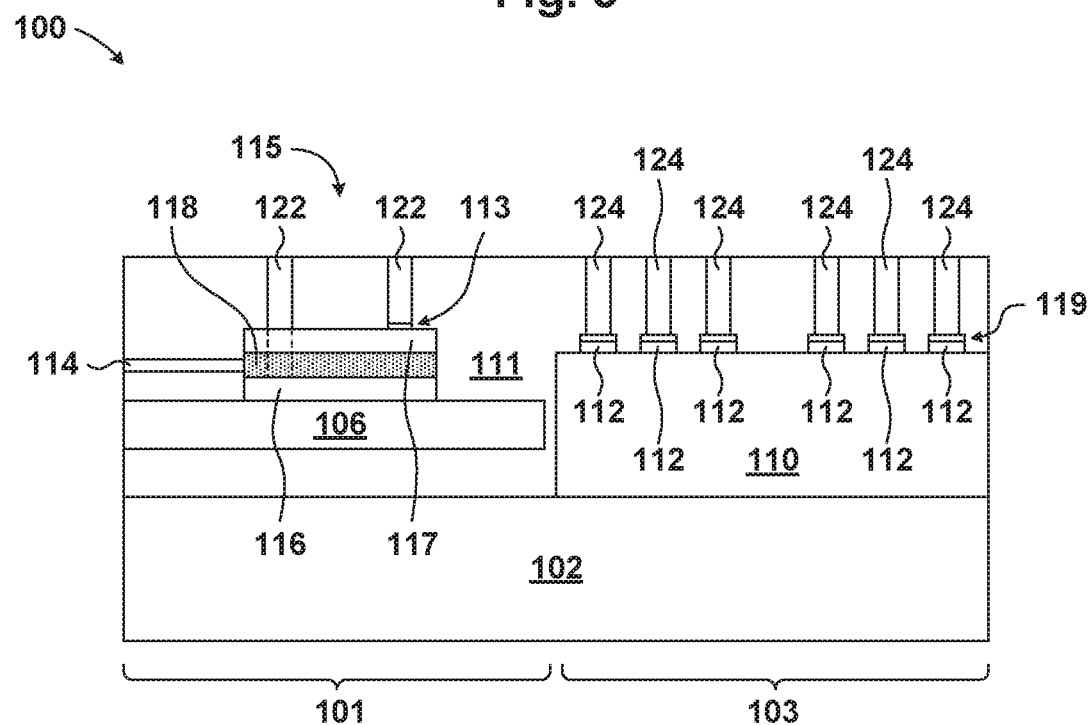
FIG. 6 is a cross section view of the semiconductor structure and illustrates the formation of an optoelectronic device contact and a device contact, according to an exemplary embodiment.

With reference to FIG. 6, a demonstrative illustration of the structure 100 is provided during an intermediate step of a method of fabricating a III-V semiconductor optoelectronic device and a Si CMOS device on a single chip, according to an embodiment. More specifically, the method can include forming an optoelectronic device contact 122 and a device contact 124 through a top insulator layer. It should be noted, for illustrative purposes, the first insulator layer 104, the second insulator layer 108, the device insulator layer 109 and the top insulator layer may be shown as a combined insulator 111.

The top insulator layer may be formed on the optoelectronic device 115, on the second insulator layer 108, and on the device insulator layer 109 using any deposition techniques known in the art, such as, for example; ion implantation, thermal or plasma oxidation or nitridation, chemical vapor deposition, and/or physical vapor deposition. The top insulator layer may be any dielectric material known in the art, such as, for example; oxides, nitrides, or oxynitrides. In an embodiment, the top insulator layer is the same material as the first insulator layer 104, the second insulator layer 108, and the device insulator layer 109 (e.g., $SiO_2$).

An optoelectronic device contact trench and a device contact trench may be etched in the combined insulator 111 using any etching technique known in the art, such as, for example, a photolithography and/or reactive ion etching process. The optoelectronic device contact trench may include two trenches (e.g., a first trench and a second trench). The first trench may extend through the combined insulator 111 and expose a top surface of the top cladding layer 116. A second trench may extend through the combined insulator 111 and expose a top surface of the bottom cladding layer 117. The device contact trench may include a set of trenches corresponding to the number of devices used. The device contact trench may extend through the combined insulator 111 and expose a top surface of the device 112.

The optoelectronic device contact 122 may be formed in the optoelectronic device contact trench using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The optoelectronic device contact 122 may be any conductive material known in the art, such as, for example, tungsten, aluminum, silver, gold, alloys thereof, or any other conductive material. A layer of silicide 113 may line the bottom of the optoelectronic device contact 122.

The device contact 124 may be formed in the device contact trench using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The device contact 124 may be any conductive material known in the art, such as, for example, tungsten, aluminum, silver, gold, alloys thereof, or any other conductive material. A layer of silicide 119 may line the bottom of the device contact 124.

Figure 7:
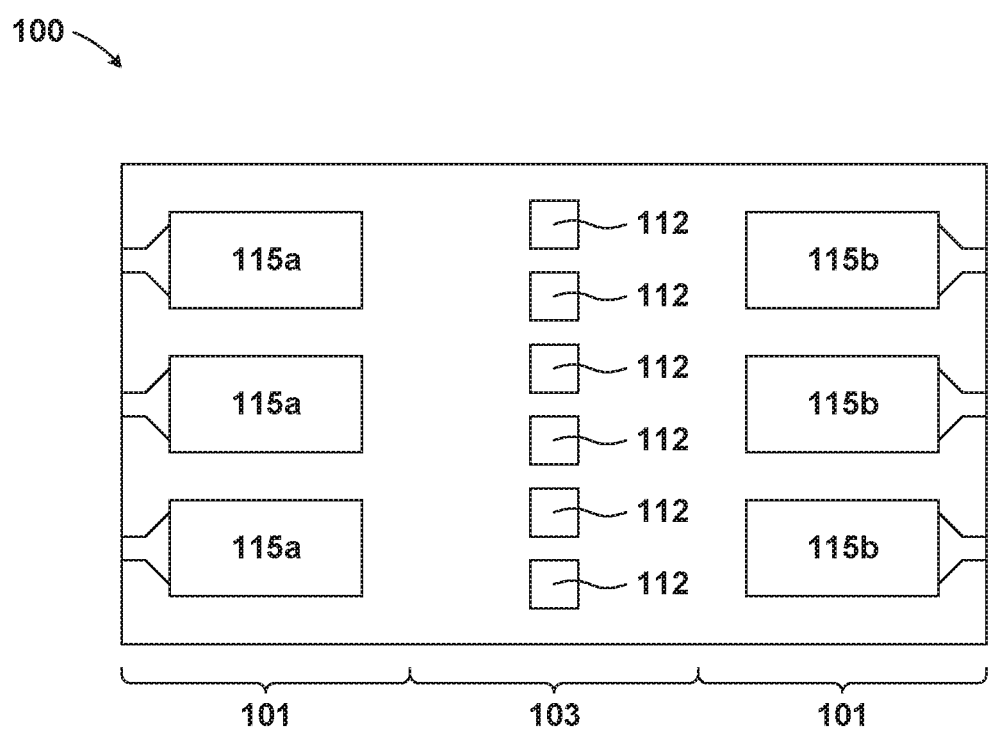
FIG. 7 is a cross section view of the semiconductor structure and illustrates a top view of the semiconductor structure, according to an exemplary embodiment.

With reference to FIG. 7, a demonstrative illustration of the structure 100 is provided during an intermediate step of a method of fabricating a III-V semiconductor optoelectronic device and a Si CMOS device on a single chip, according to an embodiment. More specifically, the optoelectronic device 115 (described above) may include a set of lasers 115a and a set of detectors 115b. The lasers 115a may connect to the detectors 115b (i.e., intra-chip connections) or to separate detectors (i.e., inter-chip connections). In an embodiment, there are two first regions 101, one region having the lasers 115a and another having the detectors 115b, where the second region 103 is between the two first regions 101. It should be noted, FIG. 7 is a top view of structure 100. Additionally, FIG. 7 is an exemplary illustration of a possible configuration, but other configurations may be used.

Figure 8:
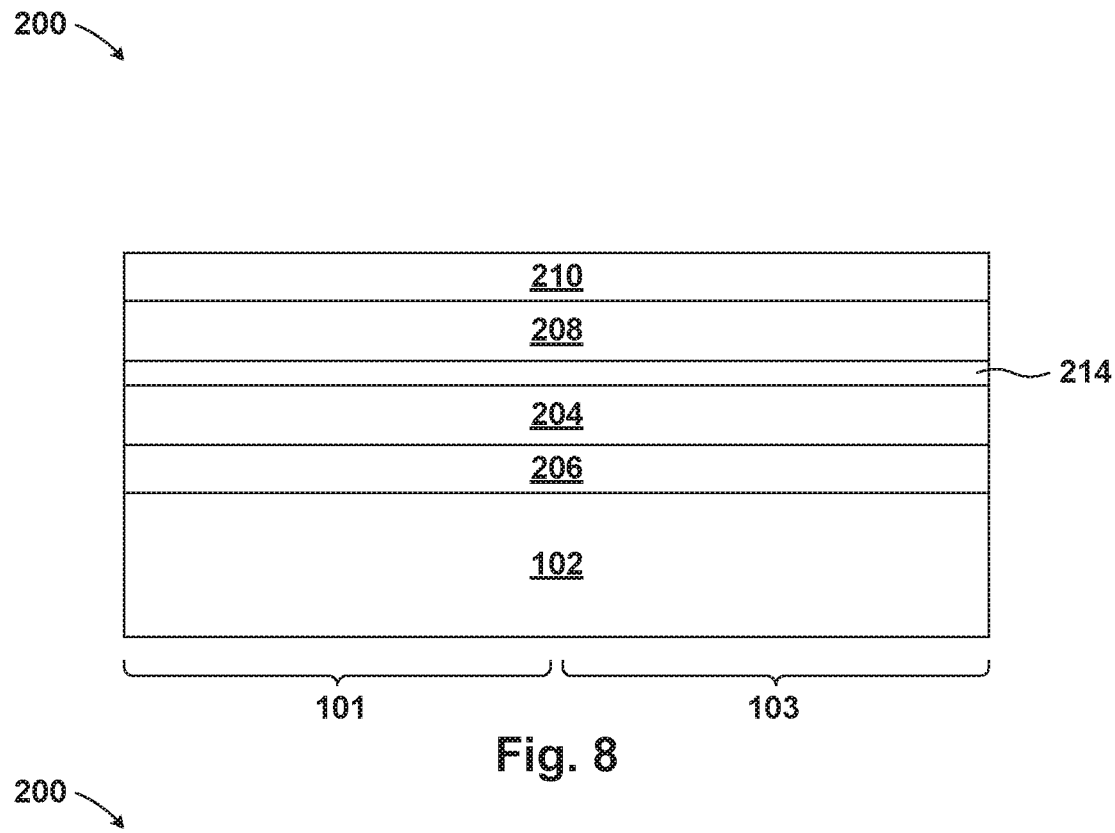
FIG. 8 is a cross section view of an alternative semiconductor structure and illustrates the formation of a stack of layers on a substrate, according to an exemplary embodiment.

With reference to FIG. 8, a demonstrative illustration of a structure 200 is provided during an intermediate step of a method of fabricating a III-V semiconductor optoelectronic device and a Si CMOS device on a single chip, according to an embodiment. More specifically, the method can start with a stack of layers including (from bottom to top) the substrate 102, a semiconductor layer 206, a first insulator layer 204, a waveguide 214, a second insulator 208, and a device base layer 210. It should be noted, structure 200 is exemplary of a waveguide-first embodiment (rather than a device-first embodiment as illustrated in FIGS. 1-6).

The semiconductor layer 206 may be formed on the substrate 102. The semiconductor layer 206 may be a similar material, and formed using a similar process, as the semiconductor layer 106 illustrated in FIG. 1. The first insulator layer 204 may be formed on the semiconductor layer 206. The first insulator layer 204 may be a similar material, and formed using a similar process, as the first insulator layer 104 illustrated in FIG. 1. The waveguide 214 may be formed on the first insulator layer 104. The waveguide 214 may be a similar material, and formed using a similar process, as the waveguide 114 illustrated in FIG. 4. The second insulator layer 208 may be formed on the waveguide 214. The second insulator 208 may be a similar material, and formed using a similar process, as the second insulator layer 108 illustrated in FIG. 2. The device base layer 210 may be formed on the second insulator layer 208. The device base layer 210 may be a similar material, and formed using a similar process, as the substrate extension layer 110 illustrated in FIG. 3.

The stack of layers may be in the first region 101 and in the second region 103. In an embodiment, the substrate 102 is silicon, the semiconductor layer 206 is germanium, the first insulator layer 204 is $SiO_2$, the second insulator layer 208 is $SiO_2$, the waveguide 214 is SiN, and the device base layer 210 is silicon.

Figure 9:
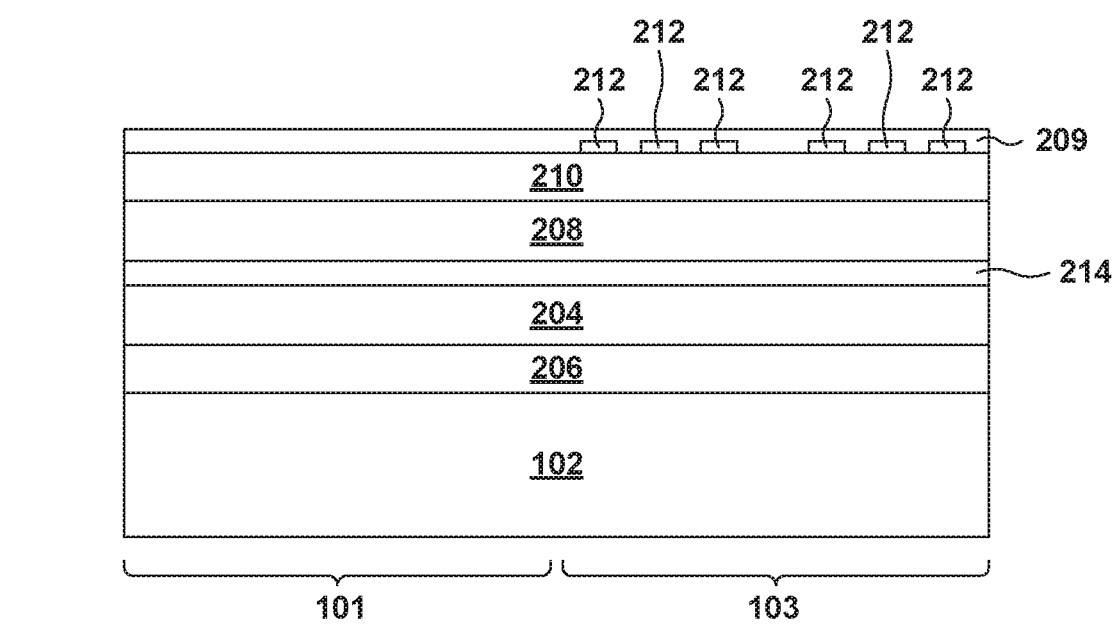
FIG. 9 is a cross section view of the alternative semiconductor structure and illustrates the formation of a device in a second region of an SOI substrate, according to an exemplary embodiment.

With reference to FIG. 9, a demonstrative illustration of the structure 200 is provided during an intermediate step of a method of fabricating a III-V semiconductor optoelectronic device and a Si CMOS device on a single chip, according to an embodiment. More specifically, the method can include forming a device 212 on the device base layer 210 in the second region 103. The device 212 may be a similar material, and formed using a similar process, as the device 112 illustrated in FIG. 3. A device insulator layer 209 may be formed on the device 212 and the device base layer 210. The device insulator layer 209 may be a similar material, and formed using a similar process, as the device insulator layer 109 illustrated in FIG. 3.

Figure 10:
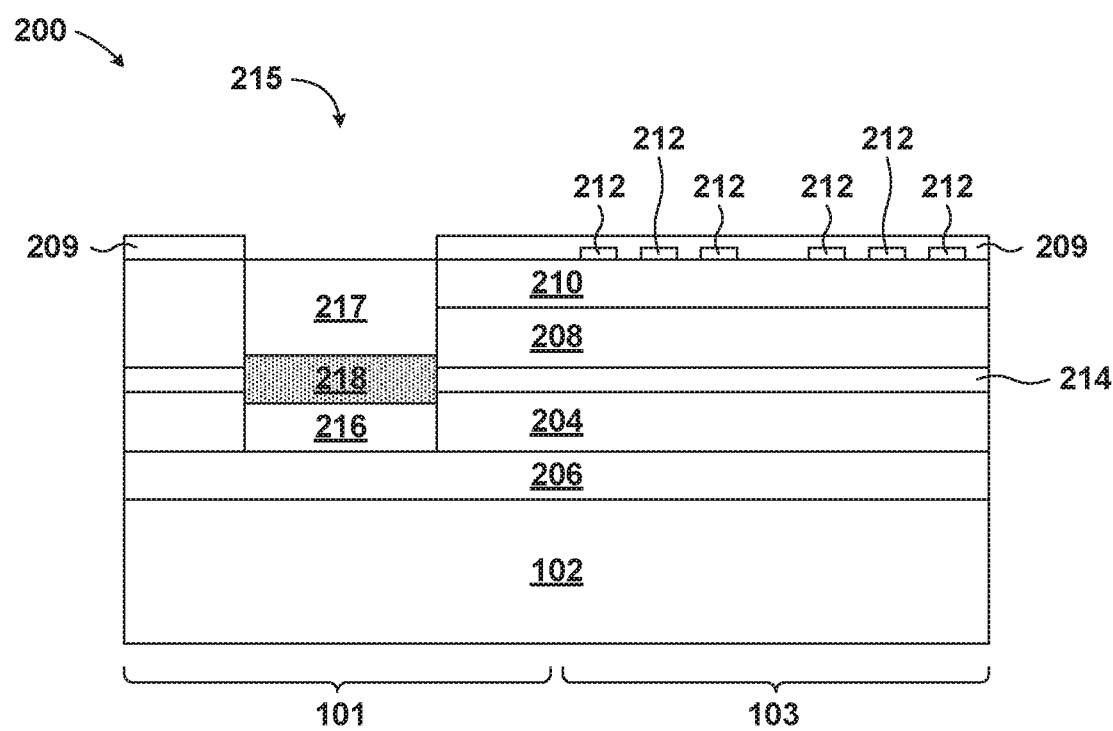
FIG. 10 is a cross section view of the alternative semiconductor structure and illustrates the formation of an optoelectronic device in a first region of the SOI substrate, according to an exemplary embodiment.

With reference to FIG. 10, a demonstrative illustration of the structure 200 is provided during an intermediate step of a method of fabricating a III-V semiconductor optoelectronic device and a Si CMOS device on a single chip, according to an embodiment. More specifically, the method can include forming an optoelectronic device 215 in the first region 101.

The optoelectronic device 215 may be similar materials, and formed using a similar process, as the optoelectronic device 115 illustrated in FIG. 5. The optoelectronic device 215 may include a bottom cladding layer 216, an active region 218, and a top cladding layer 217 formed in a trench on a top surface of the semiconductor layer 206. The structure 200 may be similar to structure 100; however, the waveguide 214 may extend underneath the device 212.

One benefit to having a laser/detector formed on the same chip as a device may include quicker processing times and lower processing costs. Germanium may be used as the semiconductor seed layer for the laser/detector because a closer lattice structure between germanium and a III-V semiconductor may result in less stress and/or misfit dislocations. The germanium may be grown on a silicon substrate or oxide such that the germanium can bridge the gap in lattice mismatch between a silicon substrate and a III-V semiconductor laser/detector.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a germanium layer above a semiconductor substrate in a first region of the semiconductor substrate;
   an optoelectronic device on the germanium layer in the first region, the optoelectronic device has a bottom cladding layer, an active region adjacent to and contacting a waveguide, and a top cladding layer, wherein the bottom cladding layer is on the germanium layer, the active region is on the bottom cladding layer, and the top cladding layer is on the active region; and
   a silicon device on a silicon layer in a second region of the semiconductor substrate,
   wherein an upper surface of the silicon layer in the second region is above an upper surface of the germanium layer in the first region.

2. The structure according to claim 1, wherein the optoelectronic device comprises a III-V semiconductor material.

3. The structure according to claim 1, wherein the silicon device is a silicon complementary metal-oxide-semiconductor (CMOS) device.

4. The structure according to claim 1, further comprising:
   a first contact, a second contact, and a device contact, wherein the first contact is directly connected to the top cladding layer, the second contact is directly connected to the bottom cladding layer, and the device contact is directly connected to the silicon device.

5. The structure according to claim 1, wherein the waveguide is embedded in an insulator layer and in direct contact with a sidewall of the active region of the optoelectronic device.

6. The structure according to claim 1, further comprising:
   an insulator layer substantially covering both the optoelectronic device in the first region and the silicon device in the second region.

7. A structure comprising:
   a germanium layer above a semiconductor substrate in a first region of the semiconductor substrate;
   an optoelectronic device on the germanium layer in the first region, the optoelectronic device has a bottom cladding layer, an active region adjacent to and contacting a waveguide, and a top cladding layer, wherein the bottom cladding layer is on the germanium layer, the active region is on the bottom cladding layer, and the top cladding layer is on the active region; and a silicon device on a silicon layer in a second region of the semiconductor substrate,
wherein both the top cladding layer and the bottom cladding layer are AlGaAs and the active region is GaAs.

8. The structure according to claim 7, wherein the optoelectronic device comprises a III-V semiconductor material.

9. The structure according to claim 7, wherein the silicon device is a silicon complementary metal-oxide-semiconductor (CMOS) device.

10. The structure according to claim 7, further comprising:
a first contact, a second contact, and a device contact, wherein the first contact is directly connected to the top cladding layer, the second contact is directly connected to the bottom cladding layer, and the device contact is directly connected to the silicon device.

11. The structure according to claim 7, wherein the waveguide is embedded in an insulator layer and in direct contact with a sidewall of the active region of the optoelectronic device.

12. The structure according to claim 7, further comprising:
an insulator layer substantially covering both the optoelectronic device in the first region and the silicon device in the second region.

13. A structure comprising:
a germanium layer above a semiconductor substrate in a first region of the semiconductor substrate;
an optoelectronic device on the germanium layer in the first region, the optoelectronic device has a bottom cladding layer, an active region, and a top cladding layer, wherein the bottom cladding layer is on the germanium layer, the active region is on the bottom cladding layer, and the top cladding layer is on the active region;
a silicon device on a silicon layer in a second region of the semiconductor substrate; and
a waveguide embedded within an insulator layer, the waveguide is in direct contact with a sidewall of the active region of the optoelectronic device, wherein both the top cladding layer and the bottom cladding layer are AlGaAs and the active region is GaAs.

14. The structure according to claim 13, wherein the optoelectronic device comprises a III-V semiconductor material.

15. The structure according to claim 13, wherein the silicon device is a silicon complementary metal-oxide-semiconductor (CMOS) device.

16. The structure according to claim 13, further comprising:
a first contact, a second contact, and a device contact, wherein the first contact is directly connected to the top cladding layer, the second contact is directly connected to the bottom cladding layer, and the device contact is directly connected to the silicon device.

17. The structure according to claim 13, wherein the insulator layer substantially covers both the optoelectronic device in the first region and the silicon device in the second region.

* * * * *